United States Patent
Lee et al.

(10) Patent No.: US 11,158,715 B2
(45) Date of Patent: *Oct. 26, 2021

(54) VERTICAL FET WITH ASYMMETRIC THRESHOLD VOLTAGE AND CHANNEL THICKNESSES

(71) Applicant: International Business Machines Corporation, Armonk, NY (US)

(72) Inventors: Choonghyun Lee, Rensselaer, NY (US); Takashi Ando, Tuckahoe, NY (US); Jingyun Zhang, Albany, NY (US); Pouya Hashemi, Purchase, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/447,614

(22) Filed: Jun. 20, 2019

(65) Prior Publication Data
US 2020/0403065 A1 Dec. 24, 2020

(51) Int. Cl.
| | |
|---|---|
| *H01L 29/76* | (2006.01) |
| *H01L 29/423* | (2006.01) |
| *H01L 29/10* | (2006.01) |
| *H01L 29/78* | (2006.01) |
| *H01L 21/8238* | (2006.01) |

(Continued)

(52) U.S. Cl.
CPC ......... *H01L 29/42392* (2013.01); *H01L 21/823885* (2013.01); *H01L 27/092* (2013.01); *H01L 29/0676* (2013.01); *H01L 29/1037* (2013.01); *H01L 29/42376* (2013.01); *H01L 29/66666* (2013.01); *H01L 29/66818* (2013.01); *H01L 29/7827* (2013.01); *H01L 29/78696* (2013.01)

(58) Field of Classification Search
CPC ............ H01L 29/1037; H01L 29/7827; H01L 21/823885; H01L 29/42392; H01L 29/66666; H01L 27/092; H01L 29/78696; H01L 29/0676; H01L 29/66818; H01L 29/42368

See application file for complete search history.

(56) References Cited

U.S. PATENT DOCUMENTS

| | | | |
|---|---|---|---|
| 7,645,650 B2 | 1/2010 | Bryant et al. | |
| 9,123,695 B2* | 9/2015 | Baek | H01L 29/1025 |

(Continued)

OTHER PUBLICATIONS

K. J. Baek et. al., Trans. Electr. Electron. Mater., 11(1) 15 (2010).

(Continued)

*Primary Examiner* — Shouxiang Hu
(74) *Attorney, Agent, or Firm* — Erik Johnson; Lou Percello, Attorney, PLLC (57) ABSTRACT

An FET comprises a source, a drain, a channel, and a gate encompassing the channel. The channel has a first region that is thinner than in a second region. The Threshold Voltage, Vth, is larger in the first region than in the second region causing an asymmetric Vth across the length of the channel. Modeling has shown that the Vth increases along the channel from about 50 milliVolts (mV) for N-FETs (about 55 mV for a P-FETs) to about 125 mV for N-FETs (about 180 mV for P-FETs) as the channel width decreases from 4 nanometers (nm) to 2 nm.

13 Claims, 11 Drawing Sheets

(51) Int. Cl.
*H01L 29/66* (2006.01)
*H01L 27/092* (2006.01)
*H01L 29/06* (2006.01)
*H01L 29/786* (2006.01)

(56) References Cited

U.S. PATENT DOCUMENTS

| | | | |
|---|---|---|---|
| 9,859,420 B1* | 1/2018 | Balakrishnan | H01L 29/1079 |
| 9,922,880 B2 | 3/2018 | Xu et al. | |
| 9,984,937 B1 | 5/2018 | Bi et al. | |
| 10,276,667 B1* | 4/2019 | Atanackovic | H01L 21/3065 |
| 10,790,357 B2* | 9/2020 | Hashemi | H01L 29/42356 |
| 2008/0050898 A1 | 2/2008 | Luan | |
| 2014/0103437 A1 | 4/2014 | Kapoor et al. | |
| 2014/0146598 A1 | 5/2014 | Sandhu et al. | |
| 2016/0005850 A1* | 1/2016 | Zhao | H01L 29/66712 |
| | | | 257/329 |
| 2020/0075716 A1* | 3/2020 | Wang | H01L 29/6681 |

OTHER PUBLICATIONS

K. Narasimhulu et. al., IEEE TED, 50, 2481 (2003).
A. Kazor, et al., "Fluorine enhanced oxidation of silicon at low temperatures", Appl, Phys, Lett. 65, 1572 (1994); https://doi.org/10.1063/1.112918; Submitted: May 3, 1994, Accepted: Jul. 12, 1994, Published Online, Aug. 5, 1998.

* cited by examiner

Figure 11

VERTICAL FET WITH ASYMMETRIC THRESHOLD VOLTAGE AND CHANNEL THICKNESSES

BACKGROUND

The present invention relates to Metal Oxide Semiconductor Field Effect Transistors (MOSFETs). More specifically, the invention relates to Vertical Field Effect Transistors (VFETs) with improved electrical characteristics.

A lateral asymmetric channel (LAC) profile approach provides one of the most effective ways to improve the electrical characteristics of VFETs. While the LAC VFET is operating, the channel voltage potential transition, as measured laterally along the channel between source and drain, is much steeper on the source side than on the drain side. A steep potential distribution near the source side enhances the lateral channel electric field between source and drain and increases the carrier mobility along the channel.

The prior art uses doping levels to achieve these steep voltage potential transitions in the channel region. However, these asymmetric potential transitions are difficult to achieve by doping for state-of-the-art devices because their channel lengths are short, e.g. less than 30 nanometers (nm) long. In short channels, charged carriers due to doping can migrate distances that are a larger percentage of the total channel length making voltage potential transitions difficult to precisely to position.

SUMMARY

Embodiments of a field effect transistor, FET, and methods of making an FET are disclosed. The FET comprises a source, a drain, a channel, and a gate encompassing the channel. The channel is between the source and drain. The channel has a source side electrically connected to the source and a drain side electrically connected to the drain. The channel has a first region with a first thickness and a first length and a second region with a second thickness and a second length. The first thickness is thinner than the second thickness and the Threshold Voltage, Vth, is larger in the first region than in the second region causing an asymmetric Vth across the length of the channel.

BRIEF DESCRIPTION OF THE DRAWINGS

Various embodiments of the present invention will be described below in more detail, with reference to the accompanying drawings, briefly described below. The Figures show various structures and related method steps.

DETAILED DESCRIPTION

It is to be understood that the various layers and/or regions shown in the accompanying drawings are not drawn to scale, and that one or more layers and/or regions of a type commonly used in a, for example, field-effect transistor (FET), FinFET, VFET, complimentary metal-oxide-semiconductor technology (CMOS), nanowire FETs, nanosheet FETs, metal-oxide-semiconductor field-effect transistors (MOSFET), single electron transistor (SET), and/or other semiconductor devices may not be explicitly shown in a given drawing. This does not imply that the layers and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin", or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings. Lateral also means traversing from side to side, e.g. moving along the length of a channel from a source side to a drain side.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Disclosed are vertical FETs (VFETs or FINFETs) with an improved performance due to the enhancement of electric field laterally along the channel. The channel has an asymmetric Threshold Voltage, Vth, profile due to the different (asymmetric) channel thickness along the length of the channel. In some embodiments, the fin/channel is thinner near the source. This causes the Vth to be higher at the source side of the channel.

Fin/channel thickness is controlled by implanting either Fluorine (F) or Chlorine (Cl) into the fin structure at locations where the channel will be thinned. The channel material implanted with either Fluorine (F) or Chlorine (Cl) oxidizes faster than the remainder of the channel/fin and therefore can be selectively and accurately removed at a faster rate than those channel regions with no implantation.

Application of the invention to both nFET and pFET structures is disclosed.

Figure 1:
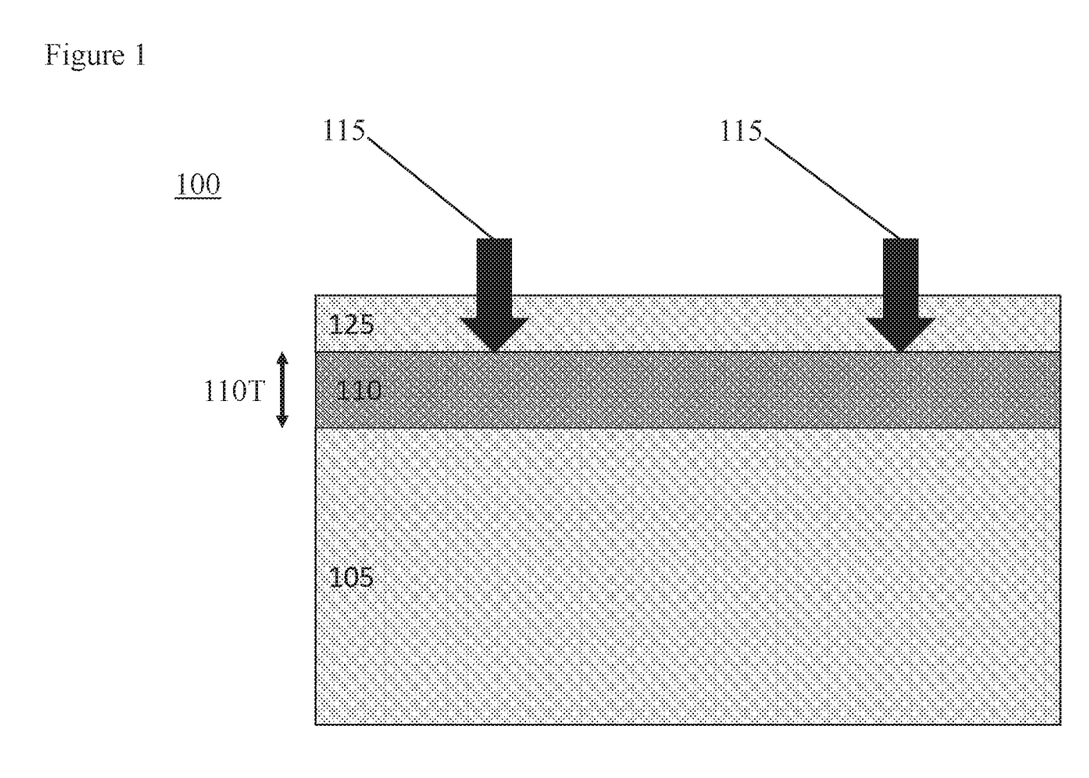
FIG. 1 is a cross section of an elevation of a beginning layered structure showing a layer with implantation of Chlorine or Fluorine.

With reference to the Figures, FIG. 1 is a cross section of an elevation of a beginning layered structure 100 showing a layer 110 with a Cl or F implantation 115.

Formation of the structure 100 begins with a substrate 105. In an embodiment, the substrate 105 is made of bulk semiconductor material including, but not limited to, silicon (Si), Si alloys, carbon doped silicon (Si:C), germanium (Ge), Ge alloys, silicon germanium (SiGe), carbon doped silicon germanium (SiGe:C), III-V compound semiconductors, II-V compound semiconductors, gallium arsenide (GaAs), cadmium telluride (CdTe), zinc selenide (ZnSe), or other like semiconductors. In addition, multiple layers of the semiconductor materials can be used.

Alternatively, the substrate 105 can be a semiconductor-on-insulator substrate such as, but not limited to, a silicon-on-insulator (SOI), silicon-germanium-on-insulator (SGOI), or III-V-on-insulator substrate including a buried insulating layer, such as, for example, a buried oxide, nitride layer or aluminum oxide.

In some embodiments, the substrate 105 is made of silicon.

Then an implantation layer 110 is formed.

In some embodiments, the implantation 115 is formed by ion implantation of the substrate 105. The energy level of the ion implantation 115 can determine the thickness 110T of the implantation layer 110 and the location of the implantation layer 110 below the surface of the initial substrate 105. Choosing the implantation energy level determines the depth below the surface of the substrate 105 where the implantation layer 110 forms and the implantation layer thickness 110T. Accordingly, a layer of substrate material 125 remains above the location of the implantation layer 110.

In some embodiments, the ion implantation 115 uses either Chlorine (Cl) or Fluorine (F) ions.

In alternative embodiments, the implantation layer 110 is grown epitaxially directly on the surface of the substrate 105. The implantation layer 110, e.g. made of Silicon (Si), is doped with either Cl or F. In these embodiments, a layer 125, made of the substrate 105 material, then is epitaxially grown on the implantation layer 110.

The concentration of the Cl or Fl in the implantation layer 110 is between $1 \times 10^{17}$ cm$^{-3}$ and $1 \times 10^{19}$ cm$^{-3}$.

Control of the thickness 110T of the implantation layer 110 enables very accurate control of the length of an implanted channel region with reduced thickness that is created later in the process.

The thickness/length 110T of the implantation layer 110 is between 5 nanometers (nm) and 30 nm.

The thickness of the top layer 125 is between 5 nm and 20 nm.

While dependent on temperature, Si oxidizes at and below 550 degrees Celsius when exposed to oxygen. Silicon implanted with Cl or Fl oxidizes at a higher rate, at some conditions in excess of 8 angstroms per minute. Therefore, implantation 115 of Cl or Fl ions in the implantation layer 110 (e.g., made of Si) creates a channel region that can be oxidized selectively at a higher rate than channel regions (e.g. made of Si) with no implantation.

Figures 2, 2A:
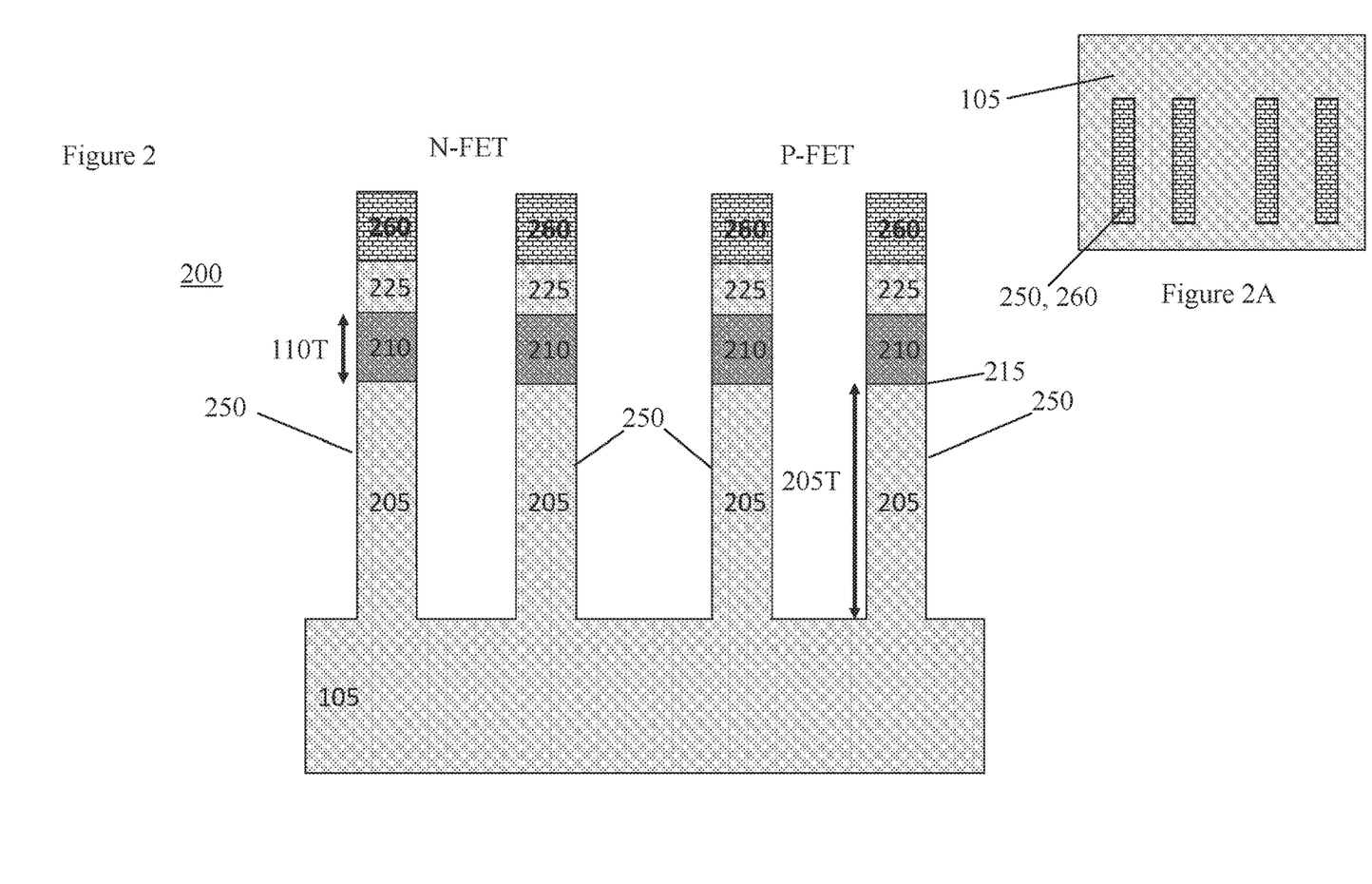
FIG. 2 is a cross section of the elevation of an interim structure after a multiple fin formation.
FIG. 2A is a top view of the interim structure in FIG. 2.

FIG. 2 is a cross section of the elevation of an interim structure 200 after a multiple fin 250 formation. After formation of a hard mask pattern layer on structure 100, the fins 250 can be formed by a standard etch process, e.g. reactive ion etching (RE), suitable to remove the materials in the structure 100. In this example, the left two fins 250 in the structure 200 will become n-type doped MOSFETs (N-FETs) and the right two fins 250 in the structure 200 will become p-type doped MOSFETs (P-FETs), as described below.

Each fin 250 comprises a non-implanted region 205, an implanted region 210, and a fin top 225. A fin hard mask 260 is on top of the fin top 225.

The non-implanted region 205 has a precise length/thickness 205T and the implanted region 210 has a precise position on the fin 250. The boundary 215 (typically) between the non-implanted region 205 and the implanted region 210 is also precisely located.

In some embodiments, the length 110T of the implanted region is between 20 to 50 percent of the sum of the lengths 110T and 205T, e.g. ratio of the length 110T to the sum of the length 110T and length 205T is between 20 percent to 50 percent. In some embodiments, the length 110T is between 5 to 30 nm.

Each of the fins 250 may have a width or horizontal thickness in the range of 5 nanometers (nm) to 10 nm, although other widths above or below this range may be used as desired for a given application. Each of the fins 250 may have a height or vertical thickness (in direction perpendicular to the substrate 105) ranging from 30 nm to 150 nm, although other heights above or below this range may be used as desired for a given application. A spacing between adjacent fins 150 may be in the range of 20 nm to 100 nm, although other spacing may be used as desired for a given application.

In some embodiments, the fin 250 is made of Silicon (Si).

FIG. 2A is a top view of the interim structure 200 in FIG. 2. The top of the substrate 105 is shown with top of the fin hard masks 260 that cover the fin 250.

As stated above, the fins 250 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

Figures 3, 3A:
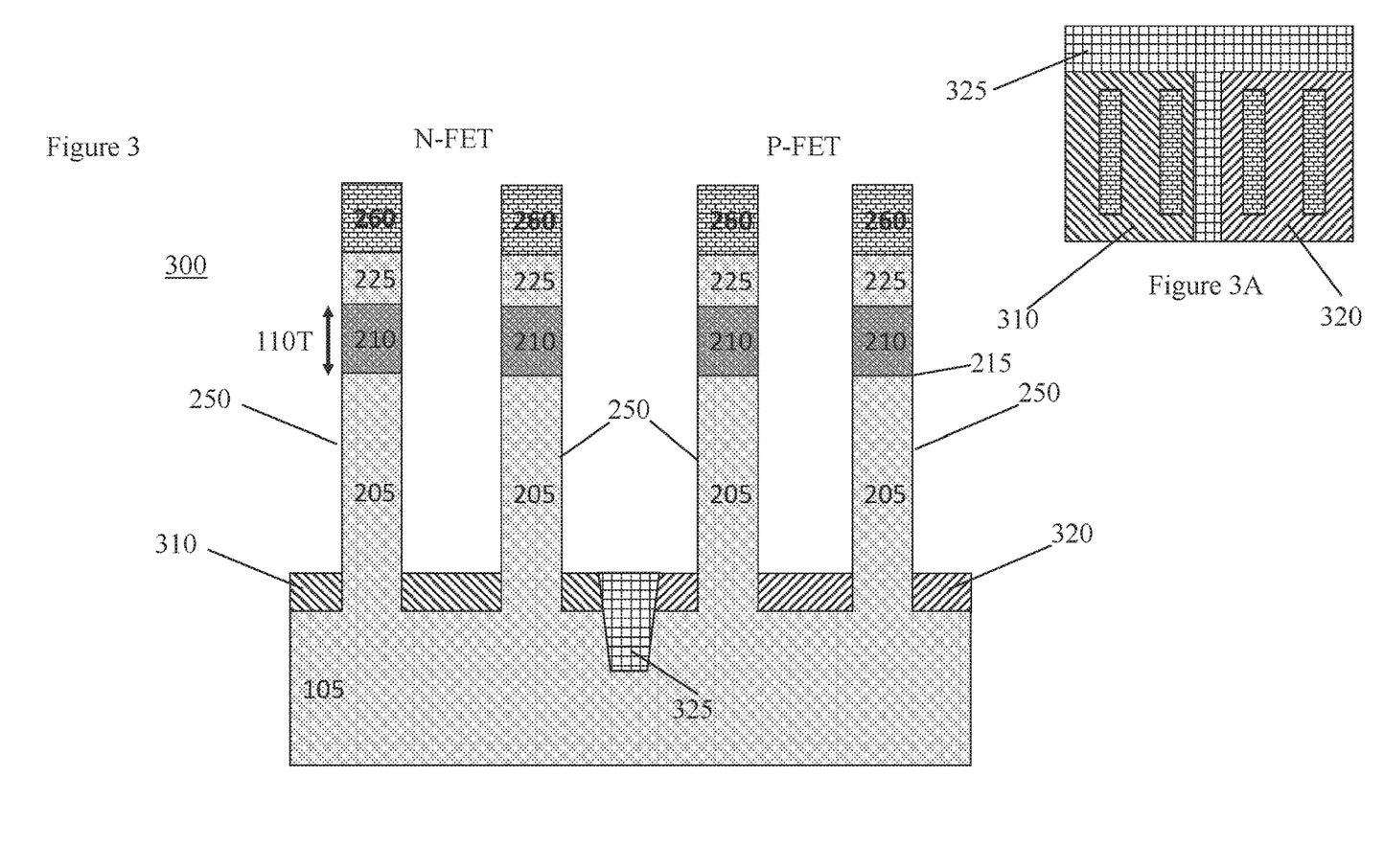
FIG. 3 is a cross section of the elevation of an interim structure after a bottom source/drain (S/D) and shallow trench isolation (STI) formation.
FIG. 3A is a top view of the interim structure in FIG. 3.

FIG. 3 is a cross section of the elevation of an interim structure 300 after a bottom source/drain (S/D) (310, 320) and shallow trench isolation (STI) 325 formation.

There is an epitaxial growth between 20 nm and 40 nm thick of an n-doped S/D 310 and a p-doped S/D 320, depending on the doping, using standard lithographic and masking processes.

Dopants include, for example, an n-type dopant (for the N-FET) selected from a group of phosphorus (P), arsenic (As) and antimony (Sb). A p-type dopant (for the P-FET) is selected from a group of boron (B), gallium (Ga), indium (In), and thallium (Tl). In some embodiments, the bottom S/D (310, 320) is doped with a dopant concentration range between $4\times10^{20}$ cm$^{-3}$ and $2.5\times10^{21}$ cm$^{-3}$.

In an embodiment, the bottom S/D (310, 320) is doped with phosphorous (P) for the N-FET S/D 310 and boron (B) for the P-FET S/D 320.

The bottom S/D (310, 320) surrounds the base of the fin 250 and is electrically, physically, and chemically connected to the bottom of the non-implanted region 205 of the fin 250.

The STI regions 325 are created by etching through the S/D (310, 320) and the surface of the substrate 105 to about 100 nm below the bottom of the S/D layers (310, 320). The etched back regions are filled with a non-conductive dielectric that electrically insulates the N-FET and P-FET S/D (310, 320) from one another. Materials used for the non-conductive dielectric include but are not limited to: oxides, nitrides, oxynitrides, or any combination thereof. In some embodiments, the STI region 325 is made of Silicon Dioxide (SiO2).

FIG. 3A is a top view of the interim structure 300 in FIG. 3. Shown are the N-FET bottom S/D 310, the P-FET bottom S/D 320 and the electrically isolating STI regions 325.

Figure 4:
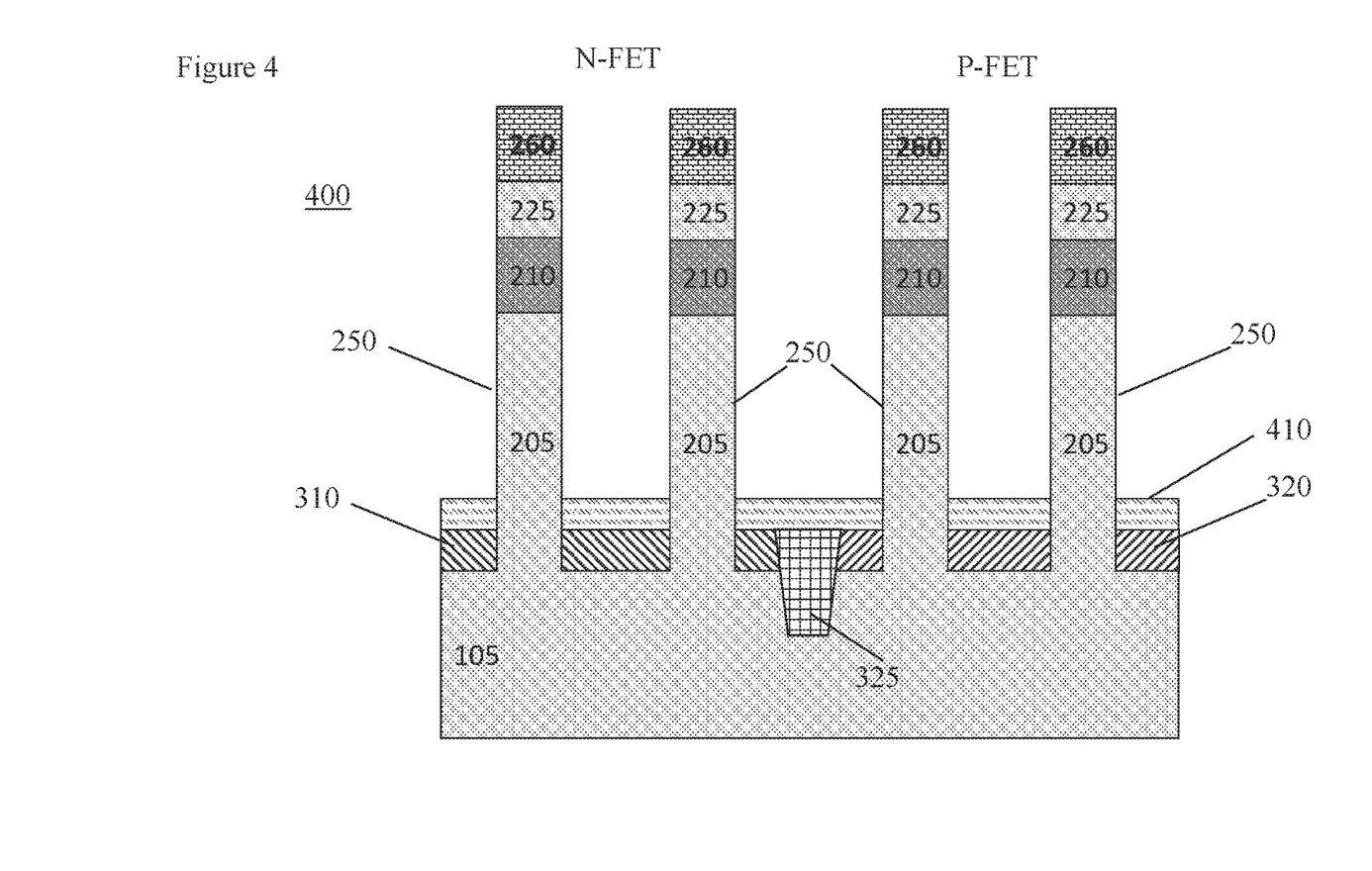
FIG. 4 is a cross section of the elevation of an interim structure after a bottom spacer formation.

FIG. 4 is a cross section of the elevation of an interim structure 400 after a bottom spacer 410 formation. The bottom spacer 410 material is non-conformally deposited with material deposition thicker on the horizontal surfaces than on the vertical surfaces. After the deposition there is an etch back step removing the bottom spacer 410 material on the vertical surfaces. The bottom spacer 410 material is an electrically insulating dielectric material. Materials include but are not limited to: oxides, nitrides, oxynitrides, or any combination thereof. In some embodiments the bottom spacer 410 is made of Silicon Nitride (SiN).

Figure 5:
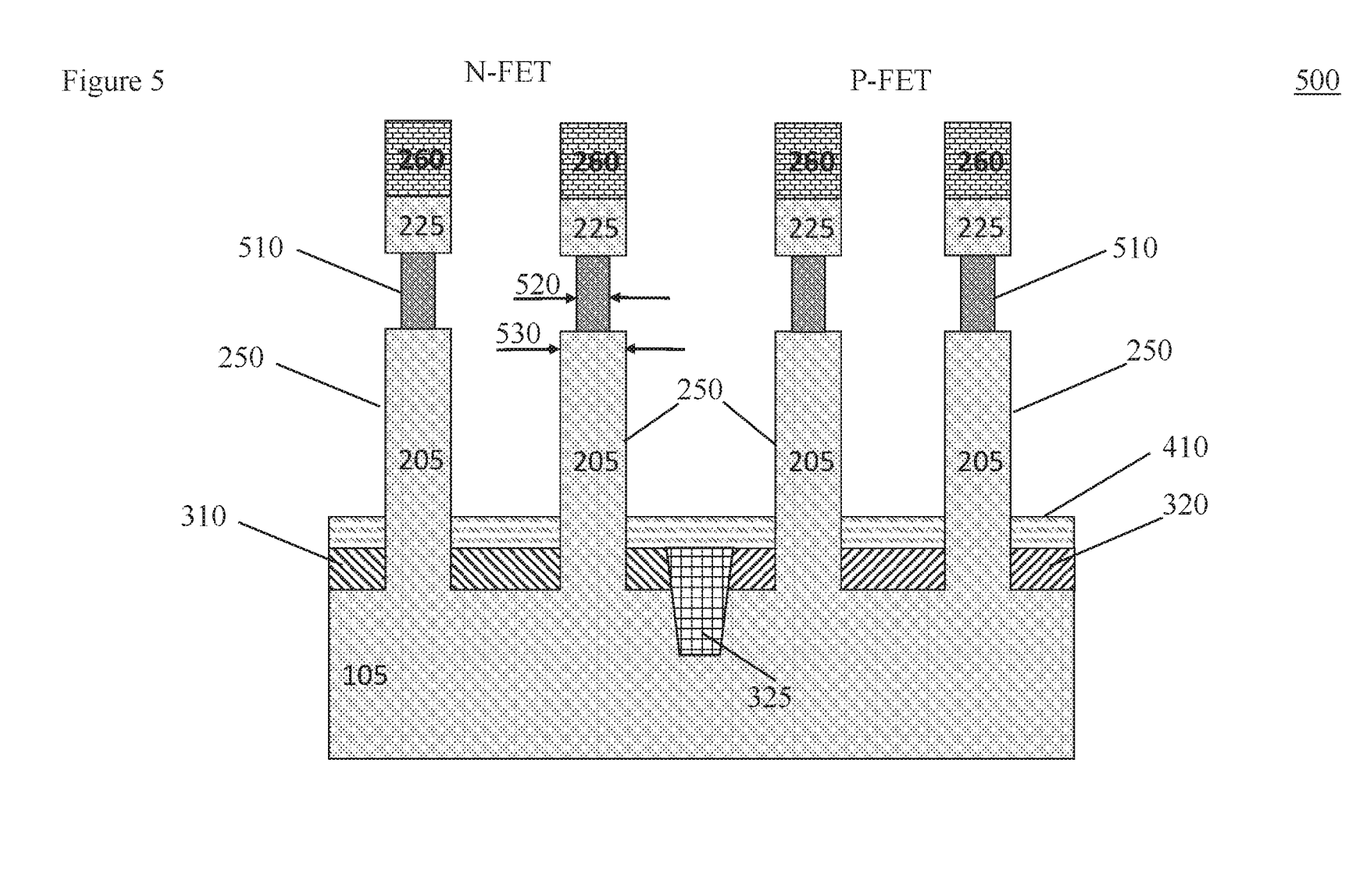
FIG. 5 is a cross section of the elevation of an interim structure after creation of multiple thinner fin/channel regions.

FIG. 5 is a cross section of the elevation of an interim structure 500 after creation of multiple thinner fin/channel regions 510. In a "soft oxidation" process, the fin 250 is trimmed by thinning the regions 510 that were implanted 115 with Cl or F.

The soft oxidation process exposes the fins 250 to an oxygen containing environment, e.g. in an oxygen chamber, at a temperature between 500 and 700 degrees Celsius. At this temperature, the Si fin 250 (including regions 205, above the bottom spacer 410; 510; and 225) oxidizes to form $SiO_2$ at the surface. The implanted region 510 oxidizes to form a $SiO_2$ layer at least twice as fast as the non-implanted regions 205 and 225 of the fin 250. Therefore, during the time of oxygen exposure within the temperature range, the $SiO_2$ formed on the surface of the implanted region 510 is at least 2 times thicker than the $SiO_2$ formed on the surface of the non-implanted regions (205, 225).

The thickness of the $SiO_2$ layer formed on both the implanted regions 510 and the non-implanted regions (205, 225) is accurately controlled by time of exposure to the oxygen and the temperature of the exposure. The bottom spacer 410 protects the S/D (310, 320), STI 325, and regions of the fin 250 below the bottom spacer 410 from oxygen exposure.

After the soft oxidation, the structure 500 is exposed to a wet etch which selectively removes the layer of SiO2 formed during the oxygen exposure. While the entire length of the fin 250 above the bottom spacer 410 is thinned by the wet etch removal of the SiO2 layer, the implanted region 510 has a thicker SiO2 layer removed. Therefore, the implanted region 510 is thinner 520 than the non-implanted regions (205, 225) of the fin 250 after SiO2 layer removal.

In some embodiments, the wet etch removal uses a buffered or diluted hydrofluoric acid solution.

In some embodiments, after removal of the SiO2 layer, the thickness 520 of the implanted region 510 is between 2 to 4 nm thinner than the thickness 530 of the non-implanted region (205 above the bottom spacer 410 and 225). In some embodiments, the thickness 520 is below 4 nm.

The implanted region 510 has a precisely controlled thickness 520 (by time and temperature exposure to oxygen), a precise length 110T controlled by the energy level of implantation (or epitaxial growth), and a precise position/interface 215 on the fin 250. The length 110T of the implanted region 510 is equal to the implantation thickness 110T. The implanted region position (e.g. interface 215) on the fin 250 as well as the length 205T of the non-implanted region 205 is determined by the controlled lithographic process that creates the fin 250.

After the channel is formed between the junctions, the thinner implanted region 510 of the channel will have a high Vth than the non-implanted region 205T. This results in an asymmetric Vth laterally along the channel region between source and drain. By positioning the implanted region 510 near the source (910, 920 formed below), the Vth near the source (910, 920) will be higher than the Vth near the drain (310, 320) of the device. The degree of variation of Vth along the channel can be controlled by how much thinner the implanted region 510 is with respect to the non-implanted region 205.

Figure 6:
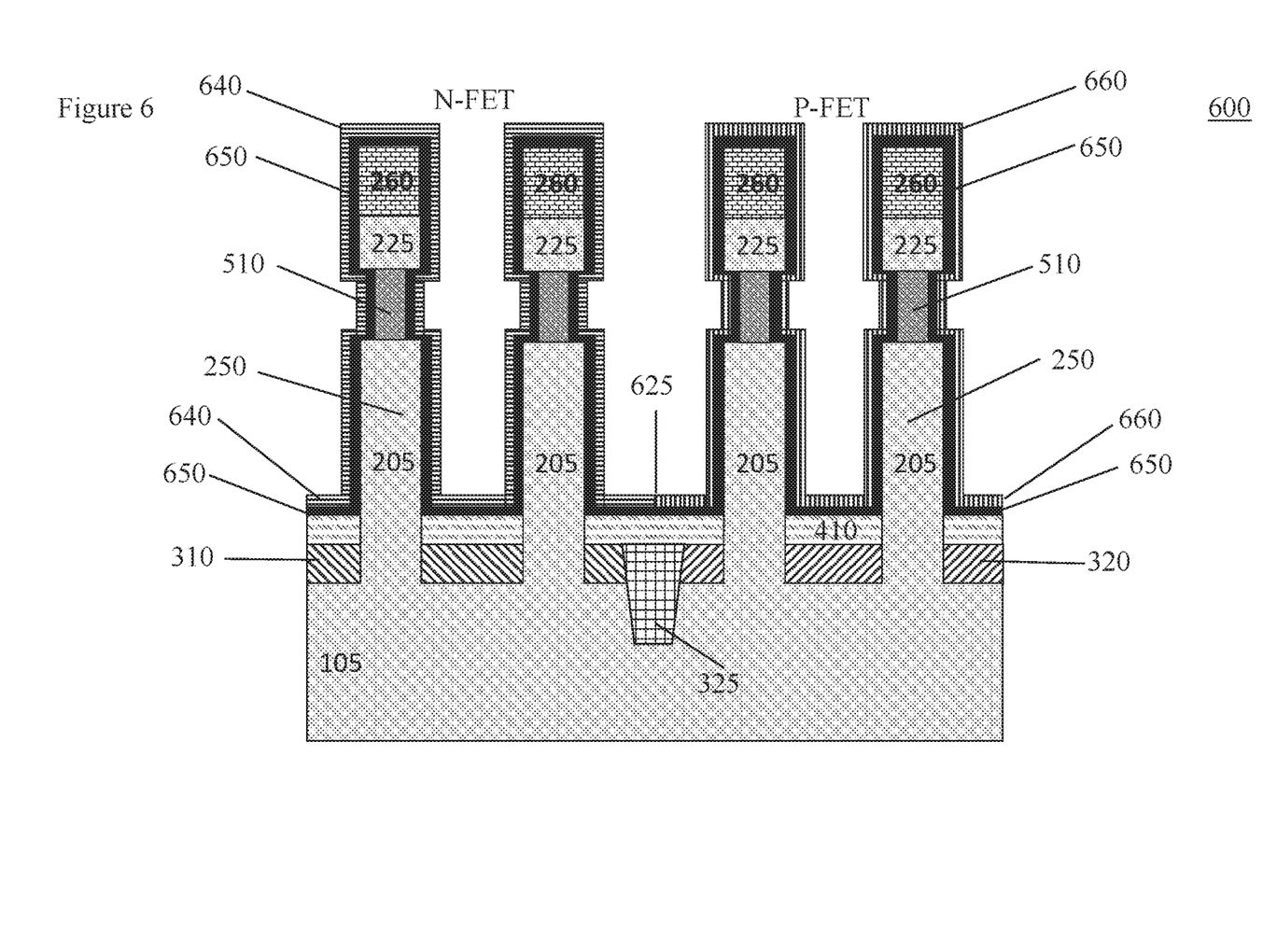
FIG. 6 is a cross section of the elevation of an interim structure after depositing a high-k layer and a work function metal (WFM) layer.

FIG. 6 is a cross section of the elevation of an interim structure 600 after depositing a high-k layer 650 and a work function metal (WFM) layer (640, 660). Part of the high-k layer 650 and WFM layer (640, 660) will form the gate, as described below.

This process begins with a conformal deposition of a high-k layer 650 of a dielectric material having a dielectric constant greater than 3.9, more preferably above 7.0, and more preferably above 10.0. Non-limiting examples of suitable materials for the high-k layer 650 dielectric material include oxides, nitrides, oxynitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The dielectric material in the high-k layer 650 may be formed by suitable deposition processes, for example, Chemical Vapor Deposition (CVD), Plasma Enhanced Chemical Vapor Deposition (PECVD), Atomic Layer Deposition (ALD), Physical Vapor Deposition (PVD), evaporation, chemical solution deposition, or other like processes. The thickness of the gate dielectric material in the high-k layer 650 may vary depending on the deposition process as well as the composition and number of high-k dielectric materials used. In some embodiments, the thickness of the high-k layer 650 is between 1 nm and 4 nm.

The WFM layer (640, 660) is deposited over the high-k layer 650 dielectric material. In some embodiments, the deposition is conformal.

The type of work function metal(s) used in the WFM layer (640, 660) depends on the type of transistor. Non-limiting examples of suitable work function metals include n-type work function metal materials 640 and p-type work function metal materials 660. N-type metal materials 640 include compositions such as hafnium, zirconium, titanium, tantalum, aluminum, metal carbides (e.g., hafnium carbide, zirconium carbide, titanium carbide, and aluminum carbide), aluminides, or any combination thereof. P-type work function materials 660 include compositions such as ruthenium, palladium, platinum, cobalt, nickel, and conductive metal oxides, or any combination thereof.

The work function metal(s)(640, 660) may be deposited by a suitable deposition process, for example: CVD, PECVD, PVD, thermal or e-beam evaporation, and sputtering. Standard masking techniques enable the deposition of the different WFM materials depending on whether the transistor is a N-FET or a P-FET.

In some embodiments, the N-FET WFM 640 and the P-FET WFM 660 are in electrical contact, e.g. an interface 625. In alternative embodiments of the N-FET WFM 640 and the P-FET WFM 660 there is a dielectric insulating material deposited between the N-FET WFM 640 and the P-FET WFM 660 so no electrical connection is made.

Figure 7:
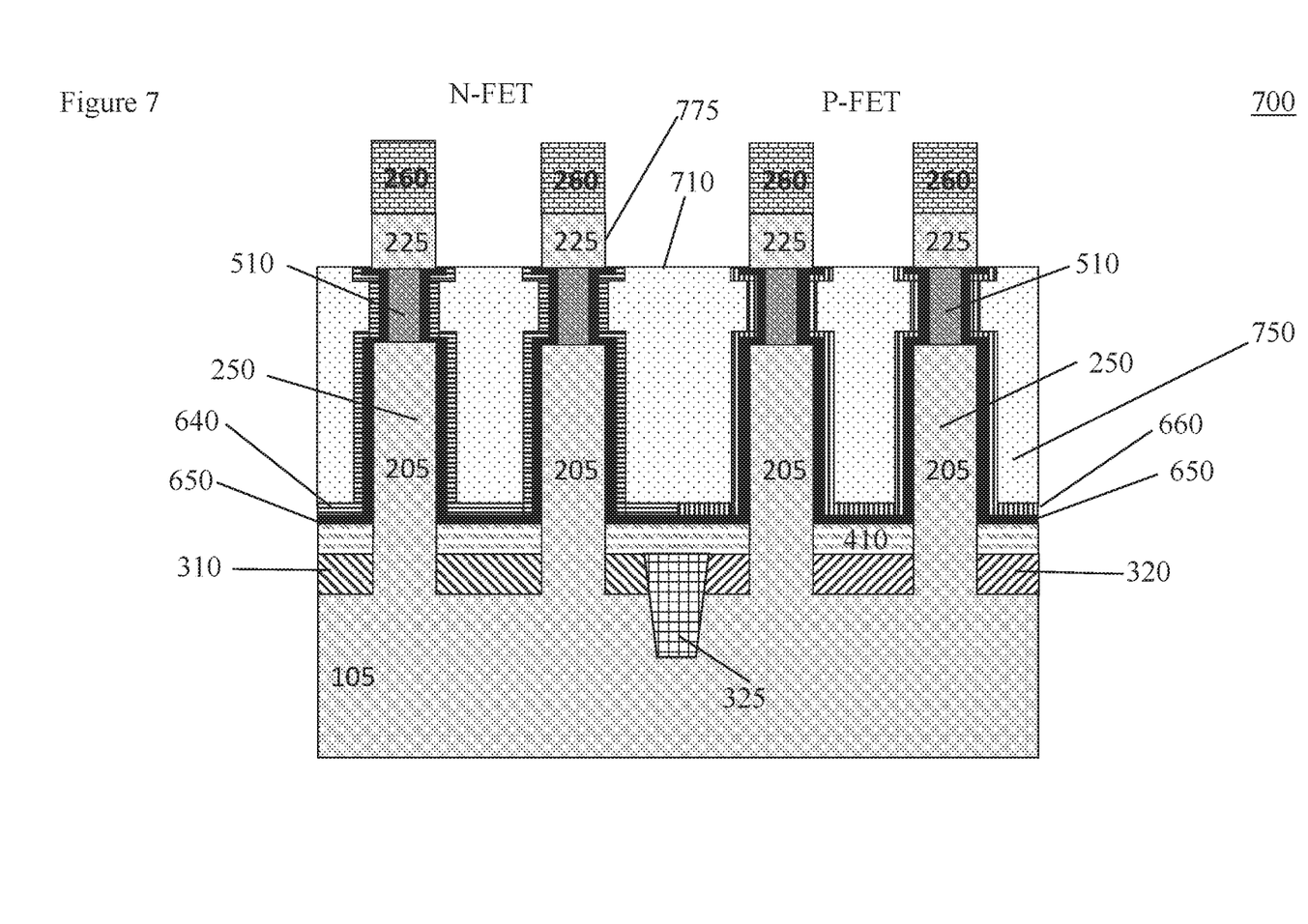
FIG. 7 is a cross section of the elevation of an interim structure after depositing an organic planarization layer (OPL) and a partial etch back of the OPL, high-k layer, and WFM layer to expose fin tops.

FIG. 7 is a cross section of the elevation of an interim structure 700 after depositing an organic planarization layer (OPL) 750 and a partial etch back 710 of the OPL, high-k layer, and WFM layer to expose 775 the fin tops 225.

This step of the process begins with a covering of the entire structure 700 with an OPL layer 750 material which fills any open regions of the structure 700. There is an optional Chemical-Mechanical Polishing (CMP) which makes the top of the OPL layer 750 and the top of the hard masks 260 coplanar. The CMP is optional because in some embodiments the OPL layer 750 material uniformly self levels so no CMP is required.

The OPL layer 750 material has low viscosity permitting the filling of small voids and is easily etched and removed. In some embodiments, the OPL layer 750 is deposited with a thick spin coating.

Next the OPL layer 750 is etched back to expose the hard mask 260 and fin top 225. In some embodiments a timed plasma etch is use with an etchant that contains either Nitrogen (N) or Hydrogen (H). These etching steps are very accurate and can position the final top 710 of the OPL layer 750 to expose 775 the fin top 225 but expose little or none of the thinned, implanted region 510 of the fin 250.

Selective etching then removes the high-k 650 and WFM (640, 660) layers encompassing the hard masks 260 and fin tops 225 while the OPL layer 750 protects the high-k 650 and WFM (640, 660) layers elsewhere (e.g. in the gate stack region) on the fin 250.

Figure 8:
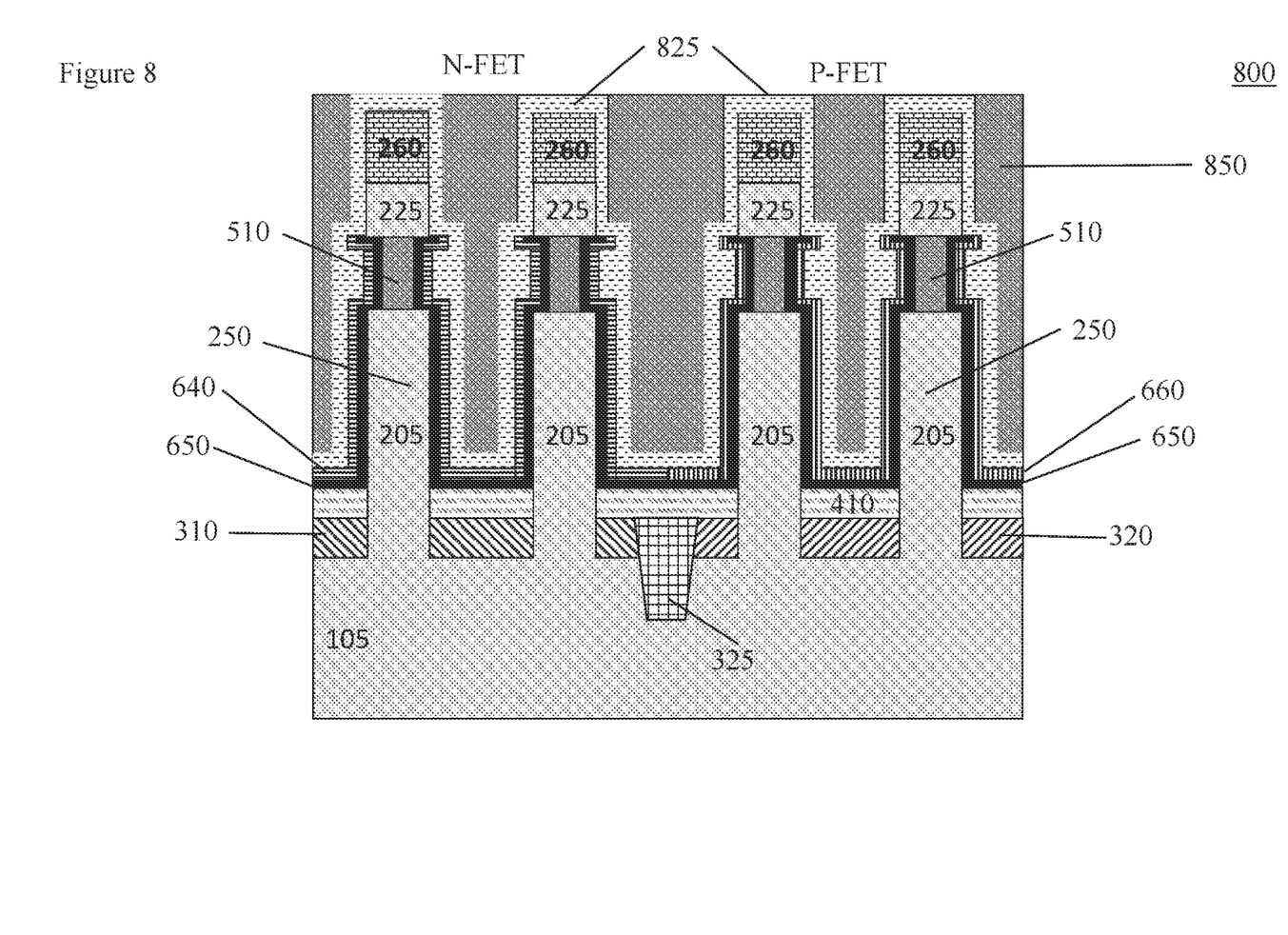
FIG. 8 is a cross section of the elevation of an interim structure after encapsulating the gate regions and depositing a filler layer.

FIG. 8 is a cross section of the elevation of an interim structure 800 after encapsulating 825 the gate stack regions and depositing a filler layer 850.

In this step, the OPL layer 750 is removed. Then there is a conformal deposition of a gate encapsulation layer 825 (typical) material that protects the remaining high-k layer 650 and WFM layer (640, 660) that comprise the gate. The gate encapsulation layer 825 material is a dielectric which in some embodiments is SiN or SiBCN.

Another dielectric deposition follows of a filler layer 850 that fills the remaining voids in the structure 800. In some embodiments, the filler layer 850 material is SiO2.

Figure 9:
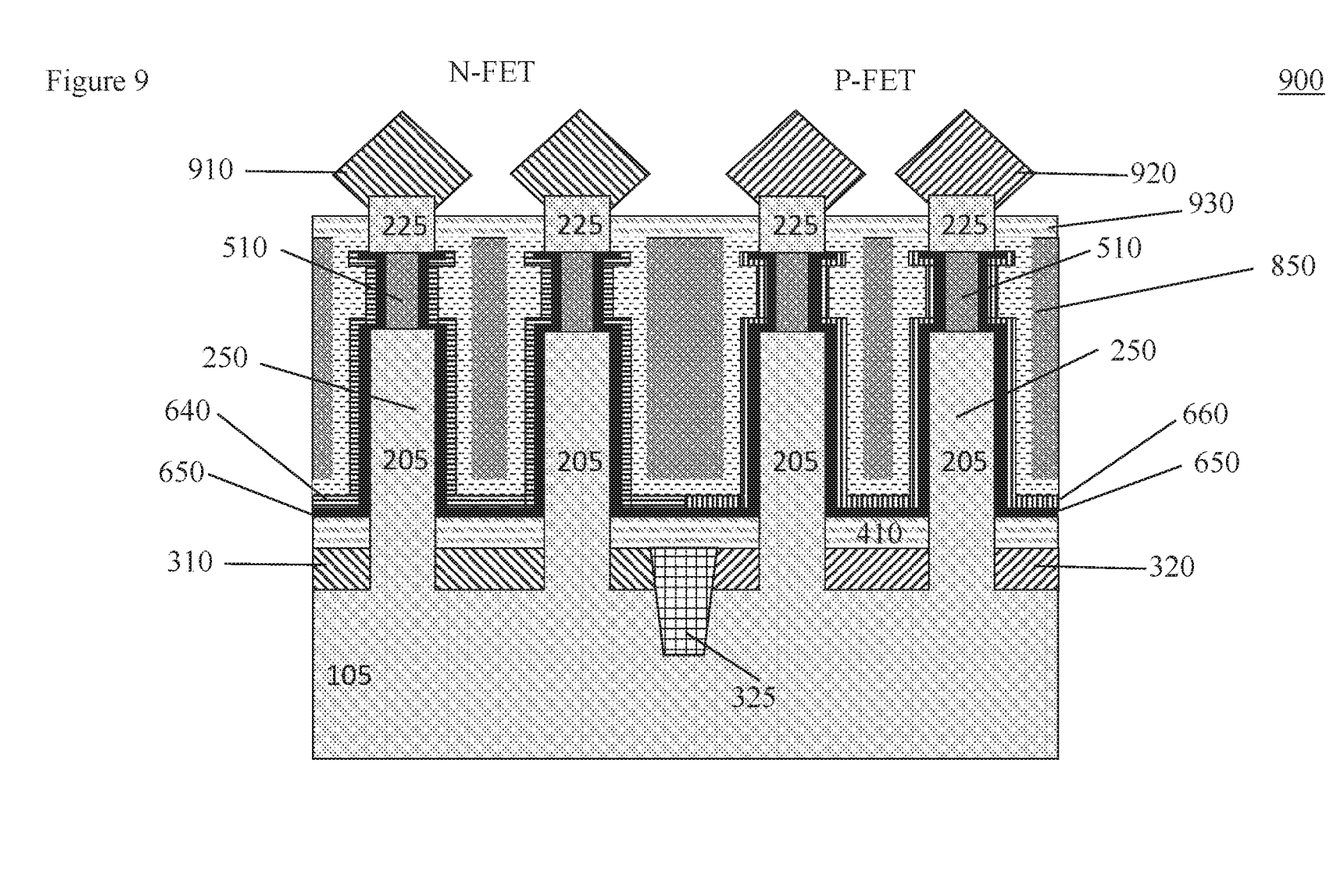
FIG. 9 is a cross section of the elevation of an interim structure after etching back, exposing the fin tops, depositing a top spacer, and growing the top S/Ds.

FIG. 9 is a cross section of the elevation of an interim structure 900 after etching back and exposing the fin tops 225, depositing the top spacer 930, and growing the top S/Ds (910, 920).

The etch back steps remove the filler layer 850 and the gate encapsulation layer 825 to expose the fin top 225 but not any material surrounding the narrow, implanted region 510 of the fin 250 or any of the material encapsulating the gate structures (650, 640, and 660). The etch back is controlled with known techniques using materials, time of etch, and temperature.

The hard masks 260 are then removed with selective material chemistries.

Now that the fin top 225 is exposed, a top spacer 930 is formed around the exposed fin tops 225. In some embodiments, the top spacer 930 is formed using the same known material and processes as used to form the bottom spacer 410.

The top S/Ds (in this example, the sources) (910, 920) are epitaxially grown. Masking and doping techniques are used appropriate to whether the N-FET or P-FET structures are being grown.

As with the prior epitaxially growth, dopants include, for example, an n-type dopant (for the N-FET) selected from a group of phosphorus (P), arsenic (As) and antimony (Sb). A p-type dopant (for the P-FET) is selected from a group of boron (B), gallium (Ga), indium (In), and thallium (Tl). In some embodiments, the top S/D (910, 920) is doped with a dopant concentration range between $4 \times 10^{20}$ cm$^{-3}$ and $2.5 \times 10^{21}$ cm$^{-3}$.

In an embodiment, the top S/D (910, 920) is doped with phosphorous (P) for the N-FET S/D 910 and boron (B) for the P-FET S/D 920.

In an embodiment, the dopants in the top S/D (910, 920) are the same as those dopants in the respective bottom S/D (310, 320).

Figure 10:
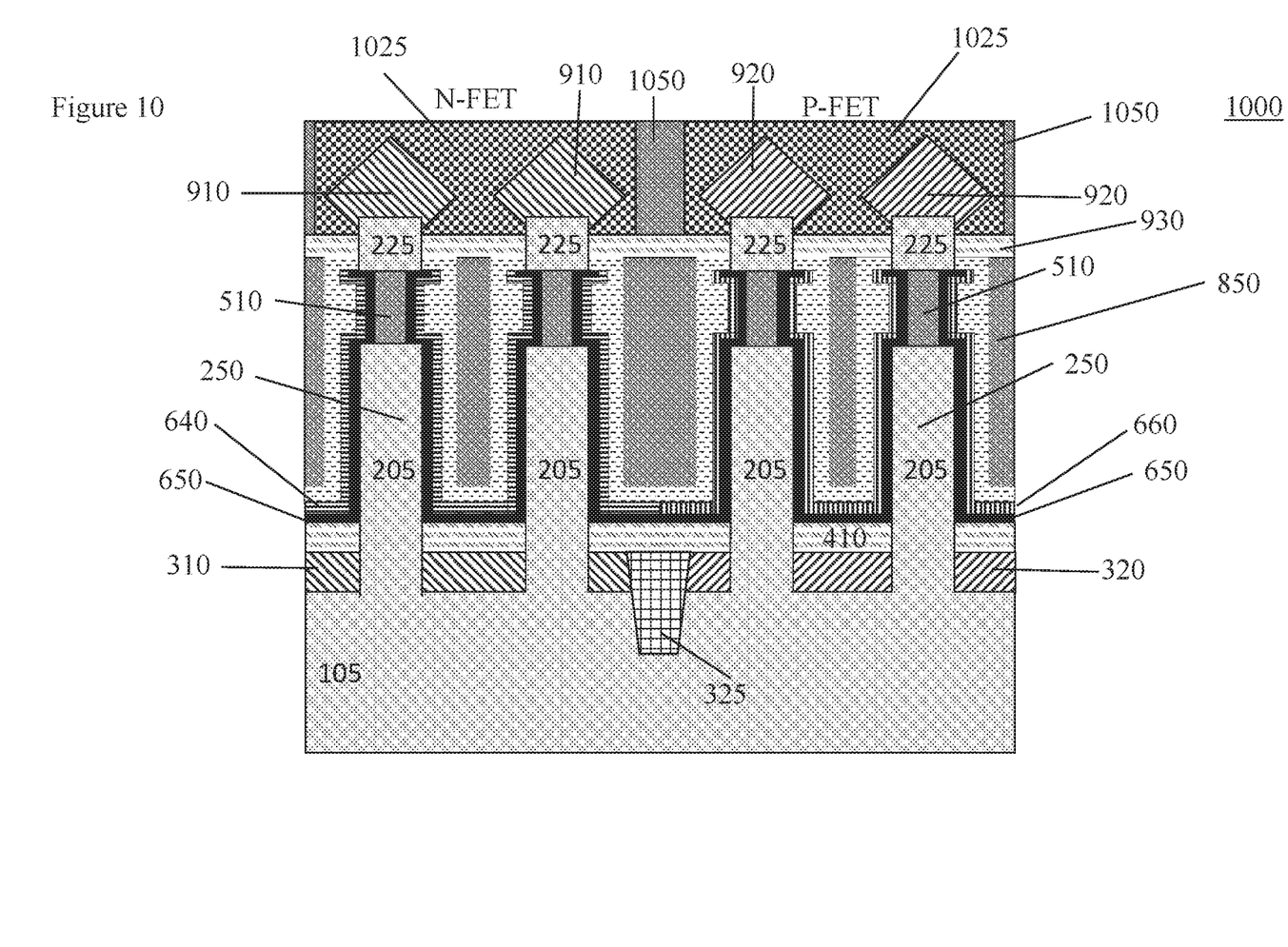
FIG. 10 is a cross section of the elevation of a structure with multiple FINFETs after forming the top S/D electrical contacts.

FIG. 10 is a cross section of the elevation of a structure 1000 with multiple FINFETs after forming the top S/D electrical contacts 1025.

In some embodiments, masking techniques are used to deposit a conductive material 1025 on and around the top S/D, e.g. source (910 and 920). The conductive material 1025 for the N-FET source 910 connection is electrically isolated from the conductive material 1025 deposited for the P-FET source 920 connection. The conductive material 1025 may be a conductive metal, for example, aluminum (Al), platinum (Pt), gold (Au), tungsten (W), titanium (Ti), Cobalt (Co) or any combination thereof.

The conductive material may be deposited by a deposition process such as CVD, PECVD, PVD, thermal or e-beam evaporation, or sputtering.

In some embodiments, a filler material 1050 is then deposited to fill in the remaining voids in structure 1000 and maintain the electrical isolation between the N-FET and P-FET connections to the respective sources (910, 920).

In some embodiments, vias (not shown) can be etched through the dielectric fill (850, 1025). The vias are filled with conductive material (not shown) to form top accessible electrical contacts to the gate (640, 660) and drain (310, 320) components of the device.

The structure 1000 is annealed for a time and at a temperature to allow migration of dopants from the top (910, 920) and bottom ((310, 320) S/D into the fin 250 to form a top and bottom junction and the undoped (or lightly doped) channel region between the junctions. The channel region includes the thinner, implanted region 510 and part of the thicker, non-implanted region 205 of the fin 250.

The temperature of the anneal has be high enough to permit diffusion of dopants into the fin 250 but low enough not to damage the already formed gate structures (650, 640, 660).

Figure 11:
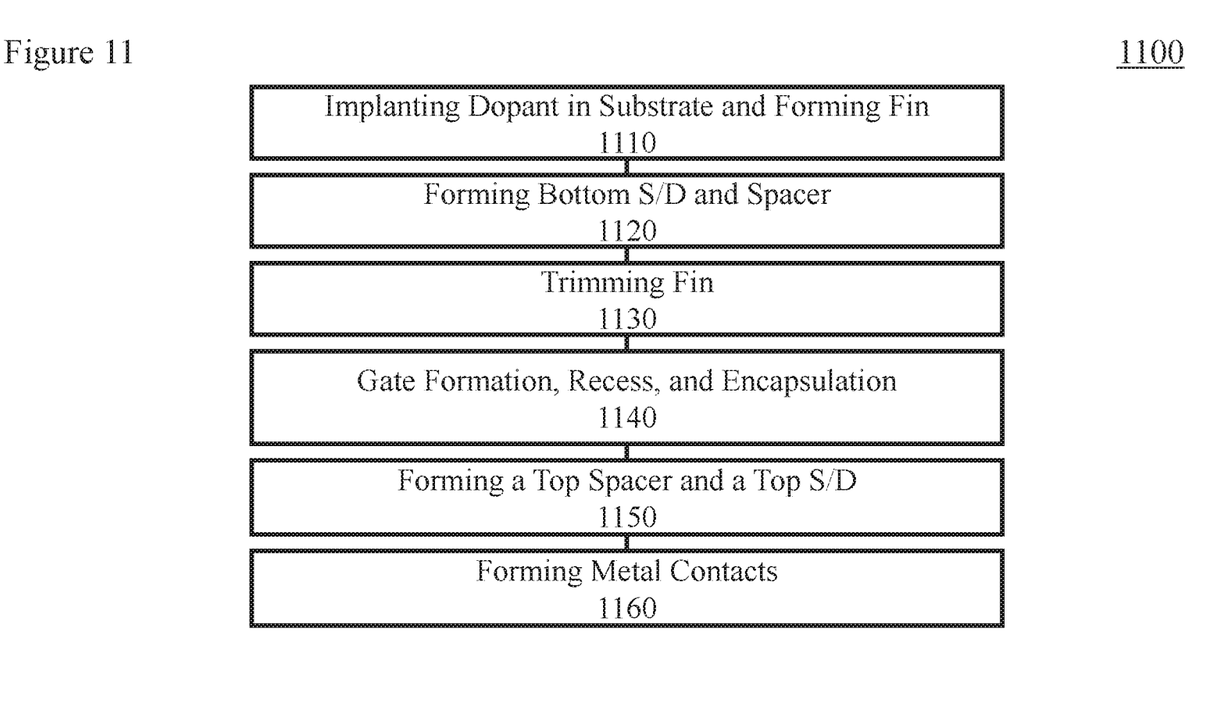
FIG. 11 is a flow chart showing the steps of making one or more FINFETs with an asymmetric channel thickness.

FIG. 11 is a flow chart showing a process 1100 with the steps of making one or more FINFETs with an asymmetric channel thickness (520, 530) and therefore an asymmetric Vth along the channel length.

Step 1110 of the process 1100 begins with implanting 115 dopants (either Cl or F) or epitaxially growing a layer 110 with dopants (Cl, Fl) in/on a substrate 105 and then forming fin structures 250. The fins 250 will have implanted regions 210 and non-implanted regions (205, 225). See description of FIGS. 1 and 2.

Step 1120 is the forming of the bottom S/D layers (310, 320) and bottom spacer 410 as disclosed in the description of FIGS. 3 and 4.

In step 1130 the implanted region 210 is trimmed or thinned as disclosed in the description of FIG. 5. The implanted region 510 is now thinner than the remainder of the fin 250, i.e. there is an asymmetric thickness along the fin 250.

Step 1140 is the process step of depositing the high-k layer of dielectric material and the WFM layer forming the gate structure as shown in FIG. 6. There is a recessing or etching back of material exposing 775 the fin top 225 followed by encapsulating 825 the gate as described in the description of FIGS. 7 and 8.

Etching back, depositing the top spacer 930, and epitaxial growing (910, 920) the top S/D (source) for both the N-FET and P-FET is performed in step 1150. See description of FIG. 9.

Depositing the connection material to connect the source (910, 920), and the gate and drain, to external circuitry occurs in step 1160. See description of FIG. 10.

Modeling has shown that Vth increases as the narrower channel width 520 decreases. The Vth increases from about 50 milliVolts (mV) for N-FETs (about 55 mV for a P-FETs) to about 125 mV for N-FETs (about 180 mV for P-FETs) as the channel width 520 decreases from 4 nm to 2 nm. An "off current" ratio decreases to nearly zero when the narrower channel width 520 is below 4 nm.

In some embodiments, the change in Vth occurs within 3 nm of the interface 215 between the narrow 520 and wider 530 channel width.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A field effect transistor, FET, comprising:
   a source;
   a drain;
   a channel between and in a direction perpendicular to the source and drain, the channel having a source side in direct electrical contact to the source and a drain side in direct electrical contact to the drain, the source side having a first region with a first thickness and a first length, the first region electrically connected to the source, and the drain side having a second region with a second thickness and a second length, the second region electrically connected to the drain; and
   a gate encompassing the channel,
   where the first thickness is thinner than the second thickness and the first thickness is a uniform first thickness along the first length and the second thickness is a uniform second thickness along the second length.

2. A FET, as in claim 1, where a ratio of the first length to the sum of the first and second lengths is between 20 percent to 50 percent.

3. A FET, as in claim 1, where the first thickness is at least 2 nanometers (nm) thinner than the second thickness.

4. A FET, as in claim 1, where the first thickness is less than 4 nm.

5. A FET, as in claim 1, that is one of an n-type FET (N-FET) and p-type FET (P-FET).

6. A FET, as in claim 1, where the channel is made of Silicon (Si).

7. A FET, as in claim 1, where the first region is doped with one of Chorine (Cl) and Fluorine (F).

8. A FET, as in claim 1, that is a vertical FET (VFET).

9. A FET, as in claim 1, where the first length is between 5 nm and 3 nm.

10. A FET, as in claim 1, where the second thickness is between 5 nm and 10 nm.

11. A FET, as in claim 1, where the FET is electrically separated from each of one or more second FETs by a shallow trench isolation (STI) formation.

12. A field effect transistor, FET, comprising:
   a source;
   a drain;
   a channel between and in a direction perpendicular to the source and drain, the channel having a source side in direct electrical contact to the source and a drain side in direct electrical contact to the drain, the source side having a first region with a first thickness and a first length, the first region electrically connected to the source, and the drain side having a second region with a second thickness and a second length, the second region electrically connected to the drain, the first thickness being thinner than the second thickness and the first thickness is a uniform first thickness along the first length and the second thickness is a uniform second thickness along the second length; and a gate encompassing the channel, where a threshold voltage, Vth, in the first region is higher than the Vth in the second region and where there is an asymmetric Vth over a length of the channel.

13. A FET, as in claim 12, where a change in the Vth occurs within 3 nm of an interface between the first and second region of the channel.

* * * * *